(12) United States Patent
Ogawa

(10) Patent No.: US 6,850,436 B2
(45) Date of Patent: Feb. 1, 2005

(54) NON-VOLATILE SEMICONDUCTOR DEVICE HAVING A MEANS TO RELIEVE A DEFICIENT ERASURE ADDRESS

(75) Inventor: Tomoya Ogawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/611,856

(22) Filed: Jul. 3, 2003

(65) Prior Publication Data

US 2004/0145946 A1 Jul. 29, 2004

(30) Foreign Application Priority Data

Jan. 27, 2003 (JP) .................................... 2003-017103

(51) Int. Cl.$^7$ .............................................. G11C 16/00
(52) U.S. Cl. ................................ 365/185.09; 365/200
(58) Field of Search ..................... 365/185.09, 185.22, 365/185.11, 200

(56) References Cited

U.S. PATENT DOCUMENTS 6,262,916 B1 * 7/2001 Kuriyama et al. ..... 365/185.24
6,556,479 B2 * 4/2003 Wada et al. ........... 365/185.09

FOREIGN PATENT DOCUMENTS

JP 2001-188712 7/2001

* cited by examiner

*Primary Examiner*—Tan T. Nguyen
(74) *Attorney, Agent, or Firm*—McDermott Will & Emery LLP

(57) ABSTRACT

In a flash memory including memory blocks and a controller for performing erasure and the like with respect to the memory blocks, in the case where a deficient erasure status is output when a certain memory block receives an erasure command, a redundancy judging circuit stores an address at that time and an address inside of a redundant block as a redundant address with respect to the address at that time in a redundant address storage region. Thereafter, when the address is accessed, the address is replaced with the redundant address stored in the redundant address storage region, so that a deficient memory block can be replaced with a redundant block.

7 Claims, 4 Drawing Sheets

NON-VOLATILE SEMICONDUCTOR DEVICE HAVING A MEANS TO RELIEVE A DEFICIENT ERASURE ADDRESS

BACKGROUND OF THE INVENTION

1. Field of the Invention

The present invention relates to a non-volatile semiconductor device, in which a memory block of deficient erasure can be automatically replaced with a redundant memory block.

2. Description of the Related Art

Since a flash memory, which is one type of non-volatile semiconductor device, is featured by repeatedly rewriting data and holding storage data even after a power source is turned off, it is frequently used as an external storage device. However, data cannot be overwritten in the flash memory. Therefore, in order to write new data in the flash memory, the storage data is erased, and then, the new data is written in the flash memory.

In the case where data cannot be erased in a certain memory block when data stored in a memory cell is erased in accordance with an erasure command, a deficient erasure status representing deficient erasure is merely output from the memory block. Therefore, a next erasure command is transmitted to the deficient memory block also at the time of next data erasure, thereby outputting a deficient erasure status.

Thus, in the case where a part of a storage region is broken in the above-described flash memory, the contents in a decoder are rewritten in order to prevent any decoding in the region, thereby enhancing the reliability (see, for example, claim 1 and FIG. 1 in Japanese Patent Application Laid-open No. 188712/2001 entitled "Storage Device Control Method").

However, since the reliability is enhanced by the entire system for controlling a writing operation or the like in a memory chip in the flash memory disclosed in Japanese Patent Application Laid-open No. 188712/2001, it is necessary to markedly change the design of the entire storage device, and further, to change the design of each of the flash memories.

SUMMARY OF THE INVENTION

The present invention has been accomplished in an attempt to solve the above-described problems observed in the prior art, and therefore, its object is to achieve a flash memory, in which a deficient chip can be replaced with an excellent chip with a minimum change of the design of a storage device in itself.

A flash memory includes memory blocks and a controller for performing erasure and the like with respect to the memory blocks upon receipt of an address and a command. According to the present invention, the flash memory further includes: a redundant memory block; a register for storing therein an input address; a redundancy judging circuit for outputting an address stored in the register and an address stored inside of the redundant memory block as a redundant address with respect to the address stored in the register in the case where a deficient erasure status representing deficient erasure is output when an erasure command is input into the memory block; and redundant address storage means for storing therein the address and the redundant address. Thus, the address is replaced with the redundant address stored in the redundant address storage means when the address input into the controller is the address stored in the redundant address storage means.

DETAILED DESCRIPTION OF THE PREFERRED EMBODIMENTS

First Embodiment

Figure 1:
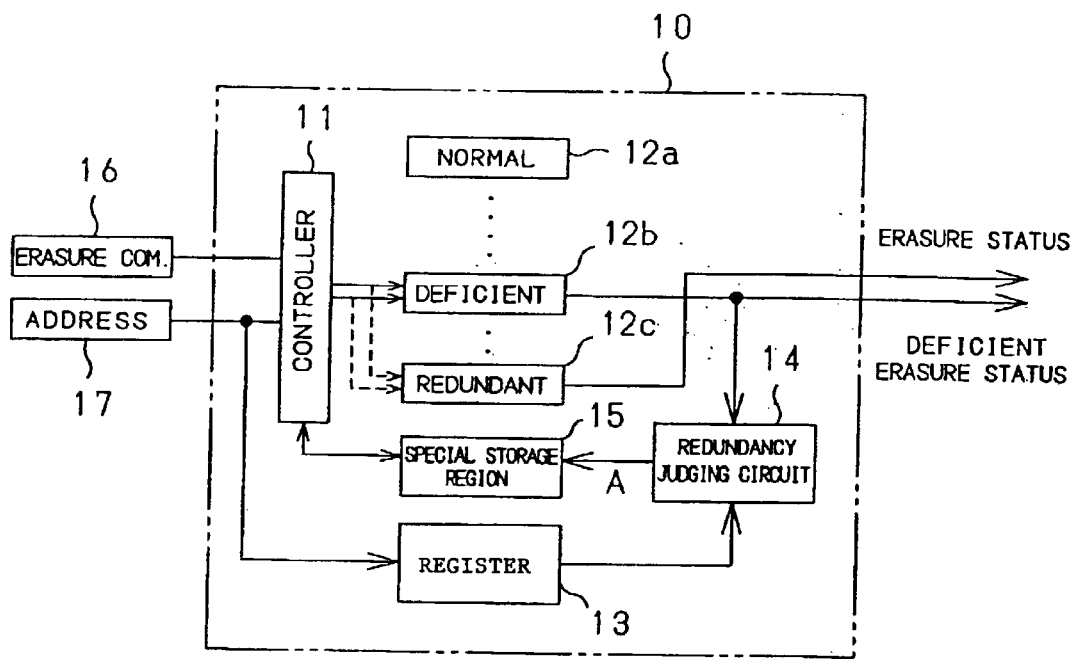
FIG. 1 is a block diagram illustrating the inside of a flash memory in a first embodiment according to the present invention.

FIG. 1 is a block diagram illustrating the inside of a flash memory 10 in a first embodiment according to the present invention. A controller 11, which analyzes a command and an operation instruction in response to a signal received from the outside so as to control operation inside of the flash memory, executes writing or erasing data in or from memory blocks 12a to 12c. In FIG. 1, the memory block 12c is used as a redundant block for redundancy in the case where deficient erasure occurs inside of the memory block. In order to erase data stored in the memory block 12b, an erasure command, which is received from an erasure command input unit 16 via the controller 11, is transmitted to the memory block 12b in accordance with an address input from an address input unit 17. When the memory block 12b is a deficient block, from which the data cannot be erased, a deficient erasure status is output from the deficient block 12b to the outside.

The conventional flash memory is operated as described above. Therefore, the deficient erasure status is output every time the erasure command is transmitted to the deficient block 12b.

In the first embodiment, the flash memory 10 comprises: a register 13 for storing therein the address received from the address input unit 17; a redundancy judging circuit 14 for outputting the address stored in the register 13 and an address stored in the redundant block 12c as a redundant address A with respect to the address stored in the register 13 when the deficient erasure status is output; and a special storage region 15 for storing therein the address output from the redundancy judging circuit 14 and the redundant address A corresponding to that address. The special storage region 15 consists of a flash memory similar to the memory block 12, so as to prevent the storage data from being erased even after a power source is turned off. The redundant address A stored in the special storage region 15 is read out by the controller 11.

In the flash memory 10 with the above-described configuration, when the erasure command is input by designating an address [a] with respect to the deficient block 12b by the address input unit 17, the deficient erasure status is output from the deficient block 12b, and further, the address [a] and the redundant address A are stored in the special storage region 15, as described above.

Thereafter, when the erasure command is input by designating the address [a] by the address input unit 17, the controller 11 checks as to whether or not the address [a] is stored in the special storage region 15. If the address [a] is stored in the special storage region 15, the redundant address A corresponding to the address [a] is read out, and then, an erasure command is transmitted to the redundant address A replaced with respect to the address [a].

The replacement of the address, as described above, allows the deficient block 12b to be replaced with the redundant block 12c. Thus, the data is erased from or written in the redundant block 12c.

Second Embodiment

Figure 2:
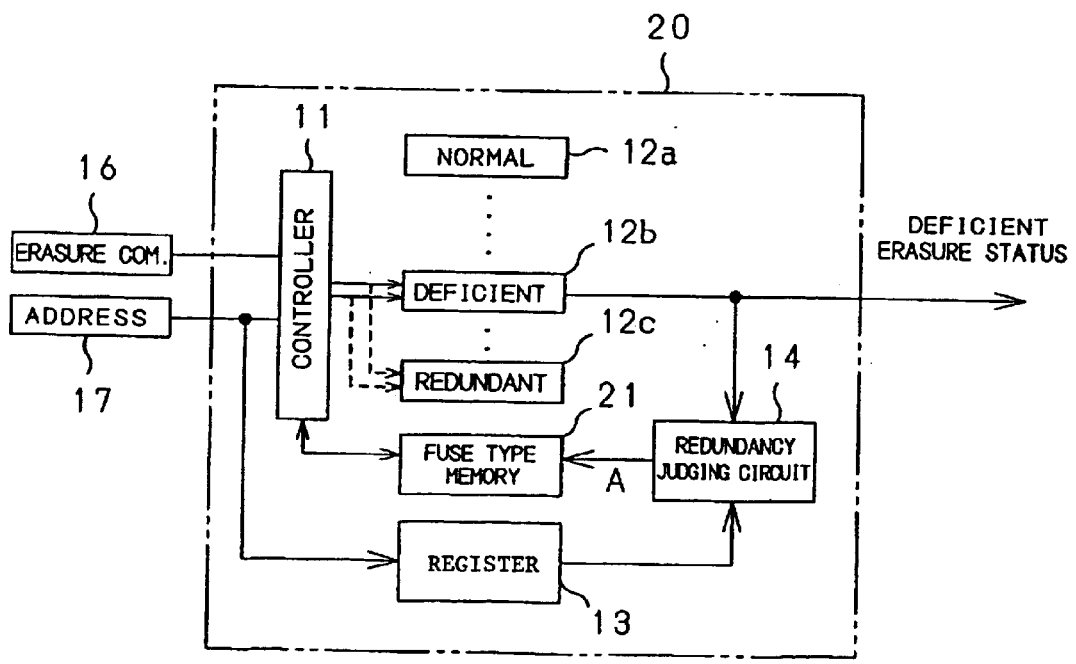
FIG. 2 is a block diagram illustrating the inside of a flash memory in a second embodiment according to the present invention.

Although one of the memory blocks constituting the flash memory is used as the special storage region 15 for storing the redundant address A in the first embodiment, a fuse type memory 21 is independently provided for storing therein data in a flash memory 20 in a second embodiment illustrated in FIG. 2. The operation of the flash memory 20 is the same as that of the flash memory 10 illustrated in FIG. 1. Since the memory can be diverted in the first embodiment, a storage device in itself can be configured with a few changes. The inexpensive fuse type memory of a simple configuration can be used in the second embodiment.

Third Embodiment

Figure 3:
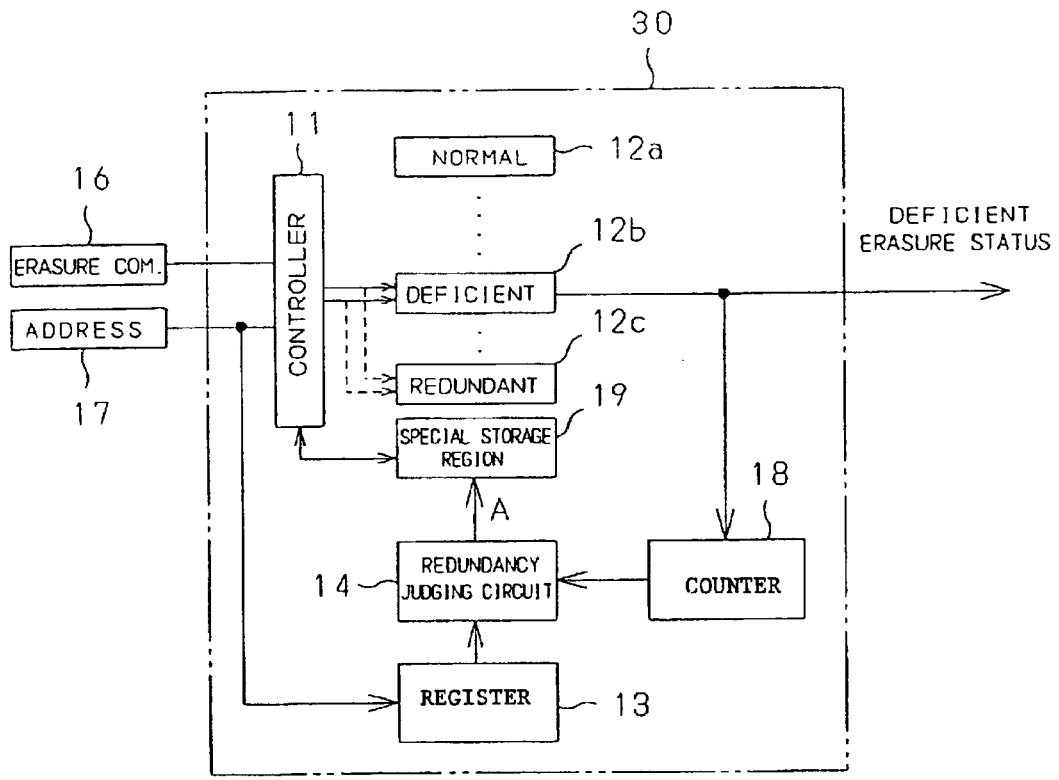
FIG. 3 is a block diagram illustrating the inside of a flash memory in a third embodiment according to the present invention.

FIG. 3 is a block diagram illustrating the inside of a flash memory 30 in a third embodiment according to the present invention. A component part illustrated in FIG. 3 different from that in the flash memory 10 illustrated in FIG. 1 is a counter 18 provided for counting the output times of a deficient erasure status, and then, for transmitting a predetermined signal to a redundancy judging circuit 14 upon counting predetermined times.

The redundancy judging circuit 14 transmits an address stored in a register 13 and an address stored in a redundant block 12c as a redundant address A with respect to the address stored in the register 13 to a special storage region 19 when the counter 18 outputs the predetermined signal. The operation onwards is the same as that illustrated in FIG. 1.

A memory chip may accidentally become deficient in erasure. If the memory block is replaced with the redundant block in accordance with such a deficient erasure status, the redundant block is liable to become short of a storage area. Thus, the memory block is judged to be a permanent deficient block in the case where the deficient erasure status is output the predetermined times in the third embodiment, so that the memory block is replaced with the redundant block.

Fourth Embodiment

Figure 4:
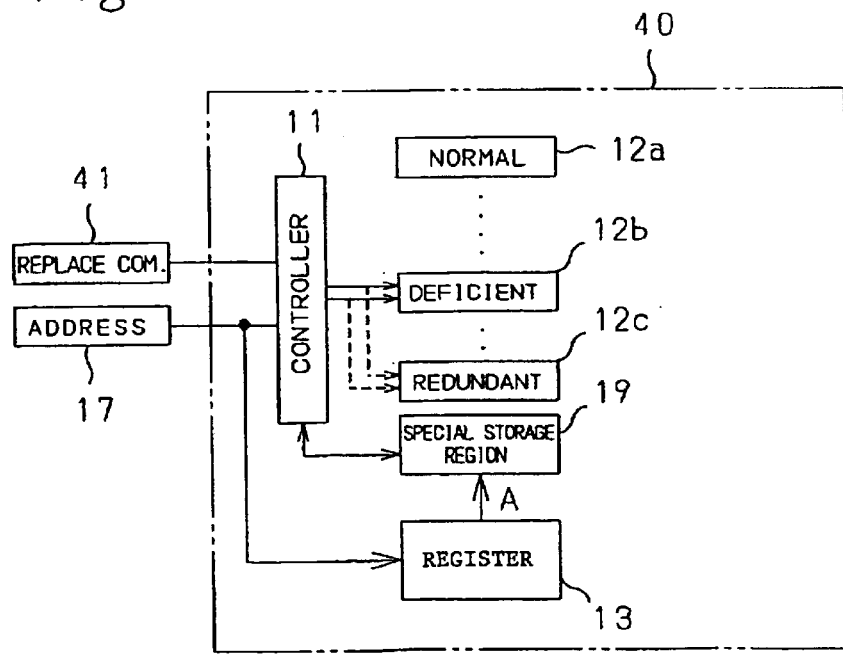
FIG. 4 is a block diagram illustrating the inside of a flash memory in a fourth embodiment according to the present invention.

In the above-described embodiments, the deficient block is automatically replaced with the redundant block when the deficient erasure status is output. However, the deficient block may be manually replaced with the redundant block only in a necessary case. FIG. 4 illustrates the configuration of a circuit in that case in a fourth embodiment. In a flash memory 40 in the fourth embodiment, when a replacement command is input from a replacement command input unit 41 together with an address at which deficient erasure occurs, the address stored in a register 13 and a redundant address A with respect to the address stored in the register 13 are written in a special storage region 19. Thereafter, like in the above-described embodiments, a deficient block 12b is replaced with a redundant block 12c.

Fifth Embodiment

Figure 5:
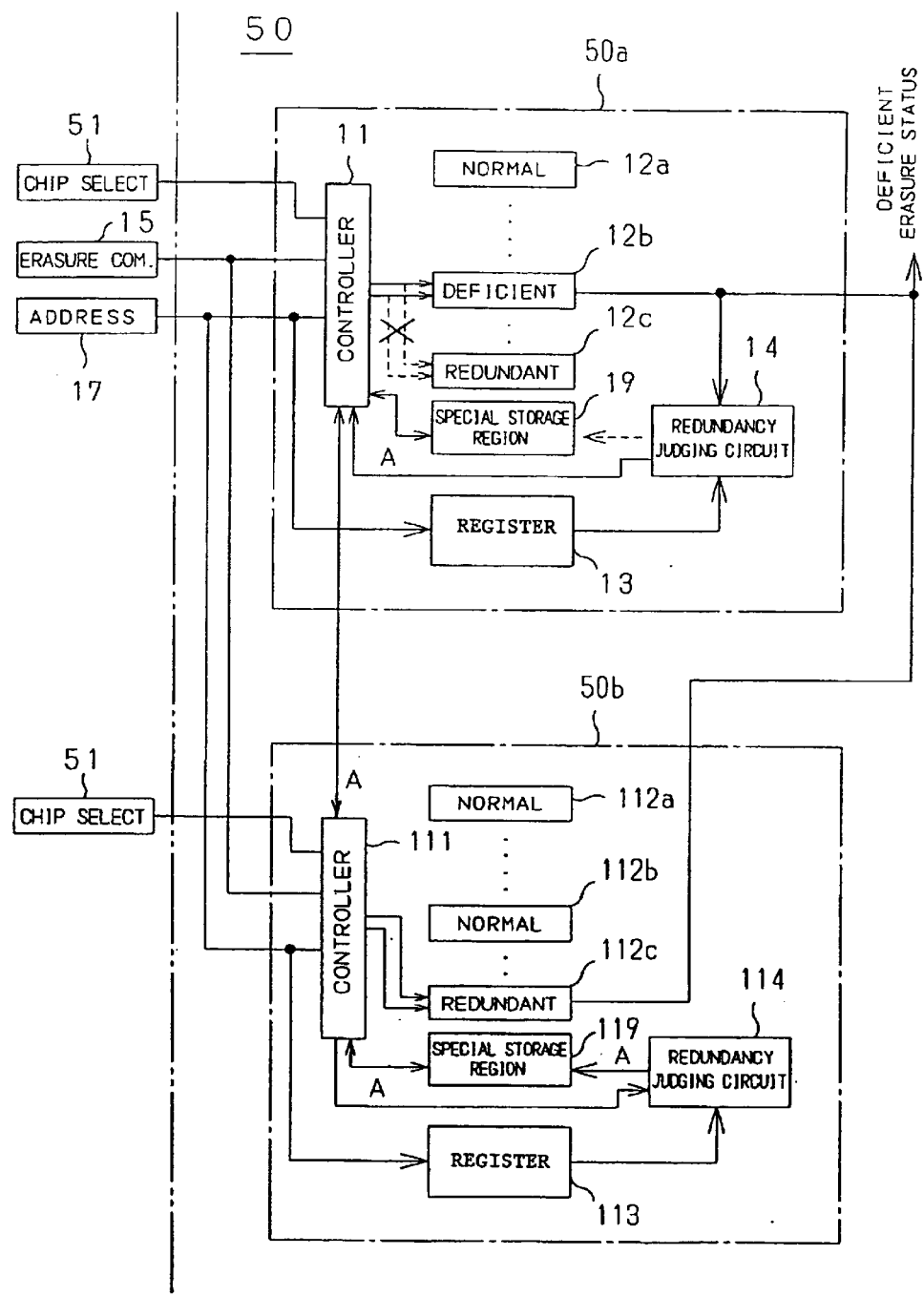
FIG. 5 is a block diagram illustrating the inside of a flash memory in a fifth embodiment according to the present invention.

FIG. 5 is a block diagram illustrating the inside of a flash memory 50 in a fifth embodiment according to the present invention. The flash memory 50 is a multi-chip package (abbreviated as "an MCP"), in which two chips 50a and 50b are packaged. Each of the chips has substantially the same configuration as that illustrated in FIG. 1. The above-described replacement technique can be applied to each of the chips. However, in the fifth embodiment, signal lines cross between both of the chips in such a manner as to divert a redundant block in one of the chips when a redundant block is short of a storage area in, for example, the other chip. Furthermore, there are provided chip select input units 51 for selecting the chips.

Consequently, when a deficient erasure status is output in a deficient block 12b on the side of, for example, the chip 50a, a redundancy judging circuit 14 transmits an address stored in a register 13 as an address to be replaced to a controller 11 in the case where there remains no storage area in a redundant block 12c replaced for the deficient block 12b.

The controller 11 transmits the address to be replaced to another controller 111 in the other chip 50b. The controller 111 transmits the address to be replaced to another redundancy judging circuit 114. The redundancy judging circuit 114 writes, in a special storage region 119, the address to be replaced and an address stored in the redundant block 112c as a redundant address A with respect to the address to be replaced.

Thereafter, when an erasure command is transmitted by designating again the address stored in the deficient block 12b inside of the chip 50a, the controller 11 checks as to whether the address is stored in a special storage region 19 or the other special storage region 119.

In this case, since the address is stored in the special storage region 119, the address is replaced with the redundant address A stored in the special storage region 119, so that the deficient block 12b inside of the chip 50a is replaced with a redundant block 112c inside of the other chip 50b, and consequently, the redundant block 112c is deleted.

With the above-described configuration, it is possible to reduce the total capacity of the redundant block 12c and the redundant block 112c, thereby enhancing the redundant efficiency.

Sixth Embodiment

Figure 6:
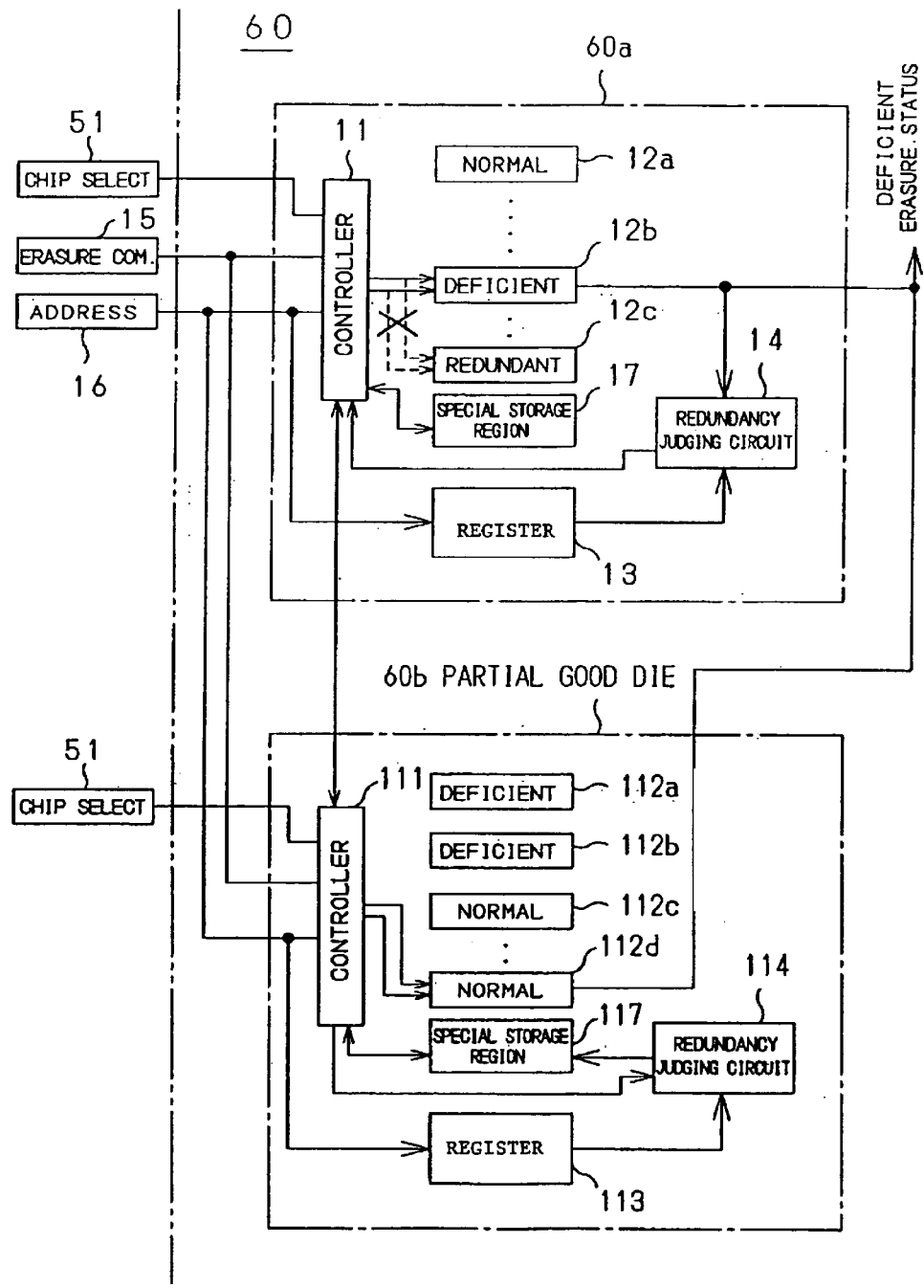
FIG. 6 is a block diagram illustrating the inside of a flash memory in a sixth embodiment according to the present invention.

FIG. 6 is a block diagram illustrating the inside of a flash memory 60 in a sixth embodiment according to the present invention. The flash memory 60 is a multi-chip package (abbreviated as "an MCP"), in which two chips are packaged, like in the flash memory 50 illustrated in FIG. 5. One chip 60b is a partial good die, which is regarded as being unusable since there are many deficient blocks. However, there also remains normal blocks in such a chip. Therefore, when a redundant block 12c is short of a usage area in the other chip 60a, the normal blocks 112d in the chip 60b are used as redundant blocks in the chip 60a. The flash memory 60 is the same in circuit configuration and operation as those of the flash memory 50 illustrated in FIG. 5.

Although the non-volatile semiconductor storage device has been exemplified by the flash memory in the first to sixth embodiments, other memories, for example, a ferroelectric memory such as a ferroelectric RAM (abbreviated as "an FRAM") or a magnetoresistive RAM (abbreviated as "an MRAM") can be used in the same manner. Moreover, although the multi-chip package has been illustrated in the fifth and sixth embodiments, a plurality of flash memories and the like may be packaged in an integral manner. Additionally, although a hard wired type is generally used as the controller, a CPU incorporating a program therein may perform a control operation.

According to the present invention, the deficient memory block is replaced with the redundant memory block inside of the memory chip, thus suppressing the change of the design of the storage device in itself to the minimum.

What is claimed is:

1. A non-volatile semiconductor device including memory blocks and a controller for performing the control of operation of the memory blocks upon receipt of an address and a command, the non-volatile semiconductor storage device comprising:

a redundant memory block provided for redundancy in the case where deficient erasure occurs inside of the memory block;

a register for storing therein an input address;

a redundancy judging circuit for outputting an address stored in the register and an address stored inside of the redundant memory block as a redundant address with respect to the address stored in the register in the case where a deficient erasure status representing deficient erasure is output from the memory block when an erasure command is input into the memory block; and redundant address storage means for storing therein the address and the redundant address;

wherein the address is replaced with the redundant address stored in the redundant address storage means when the address input into the controller is the address stored in the redundant address storage means, and memory operation is performed.

2. The non-volatile semiconductor device as claimed in claim 1, wherein the redundant address storage means consists of the memory block.

3. The non-volatile semiconductor device as claimed in claim 1, wherein the redundant address storage means consists of a fuse type memory.

4. The non-volatile semiconductor device as claimed in claim 1, wherein output times of the deficient erasure status are counted, and then, the redundancy judging circuit outputs the address and the redundant address at the time when predetermined times are counted.

5. The non-volatile semiconductor device as claimed in claim 1, wherein the address is replaced with the redundant address when a replacement command is received from the outside.

6. The non-volatile semiconductor device as claimed in claim 1, wherein in the case where the redundant memory block is short of a storage area in a certain chip if said non-volatile semiconductor storage device is a multi-chip package, a redundant memory block in another chip is diverted.

7. The non-volatile semiconductor device as claimed in claim 1, wherein in the case where the redundant memory block is short of a storage area in a normal chip if said non-volatile semiconductor storage device is a multi-chip package and a certain chip is unusable, a normal memory block inside of the unusable chip is diverted.

* * * * *